(12) United States Patent
Shin et al.

(10) Patent No.: US 7,553,047 B2
(45) Date of Patent: Jun. 30, 2009

(54) LIGHTING DEVICE

(75) Inventors: Su-ho Shin, Yongin-si (KR); Kyu-ho Shin, Yongin-si (KR); Chang-youl Moon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 4 days.

(21) Appl. No.: 11/651,064

(22) Filed: Jan. 9, 2007

(65) Prior Publication Data

US 2008/0037226 A1    Feb. 14, 2008

(30) Foreign Application Priority Data

Jun. 1, 2006    (KR) .................. 10-2006-0049297

(51) Int. Cl.
    *F21V 29/00*    (2006.01)
(52) U.S. Cl. ............... 362/294; 362/218; 362/264; 362/373; 362/547; 362/800; 361/720
(58) Field of Classification Search ............... 362/294, 362/800, 373, 218, 264, 547; 361/720
    See application file for complete search history.

(56) References Cited

U.S. PATENT DOCUMENTS 4,613,931 A * 9/1986 Messinger .................. 362/294
5,580,164 A * 12/1996 Maddox et al. ............. 362/293
2006/0092639 A1* 5/2006 Livesay et al. .............. 362/294
2007/0070629 A1* 3/2007 Hulick et al. ............... 362/294
2007/0121326 A1* 5/2007 Nall et al. ................... 362/294

* cited by examiner

*Primary Examiner*—Sandra L O'Shea
*Assistant Examiner*—Jessica L McMillan
(74) *Attorney, Agent, or Firm*—Sughrue Mion, PLLC

(57) ABSTRACT

A lighting device is provided. The lighting device includes a light source, a light source supporting member which has a surface to which the light source is attached, and a heat sink on an opposite surface of the light source supporting member, for dissipating heat generated by the light source. In addition, the heat sink includes a heat transfer member which protrudes from the surface of the light source supporting member; a plurality of first fins which are spaced apart from each other at intervals in a length direction of the heat transfer member, and are arranged parallel to the light source supporting member; and a plurality of second fins which are spaced apart from each other at intervals, surround outer portions of the first fins, and are arranged perpendicularly to the light source supporting member.

15 Claims, 15 Drawing Sheets
(3 of 15 Drawing Sheet(s) Filed in Color)

FIG. 7A
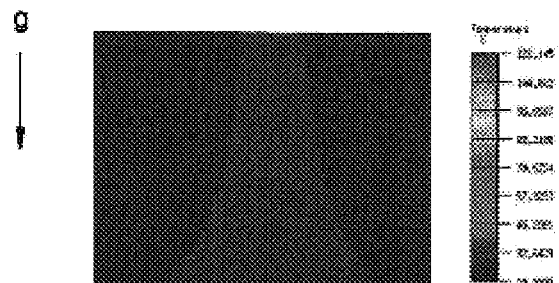
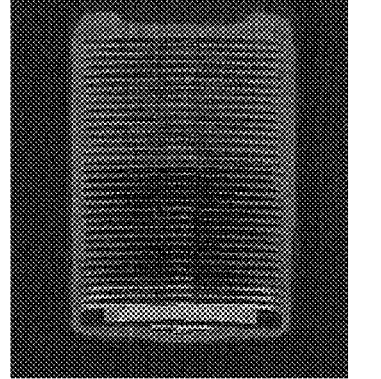
FIG. 7B
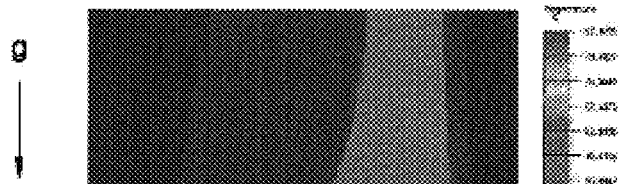
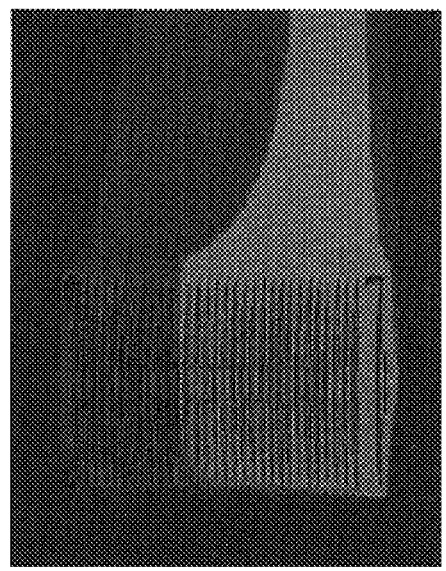

LIGHTING DEVICE

CROSS-REFERENCE TO RELATED PATENT APPLICATIONS

This application claims the benefit of Korean Patent Application No. 10-2006-0049297, filed on Jun. 1, 2006, in the Korean Intellectual Property Office, the disclosure of which is incorporated herein in its entirety by reference.

BACKGROUND OF THE INVENTION

1. Field of the Invention

The present invention relates to a lighting device, and more particularly, to a lighting device which includes a heat sink for dissipating heat generated when a light source emits light.

2. Description of the Related Art

Related art lighting apparatuses use incandescent bulbs or fluorescent lights as light sources. Recently, related art lighting apparatuses use light emitting diodes (LEDs) as the light source. The lighting apparatuses using the LEDs as the light source result in less environmental contamination, and have longer life spans than conventional lighting apparatuses.

In light apparatuses using incandescent bulbs, fluorescent lights, or LEDs as the light source, heat is generated when the light source emits light. When a temperature of the light source rises due to the heat generation of the light source, the life span of the lighting apparatus is reduced, and a color of the light is changed. Therefore, an efficient heat sink for dissipating the heat generated from the light source is required.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a lighting apparatus which includes a heat sink that can dissipate heat reliably, regardless of an arrangement angle of the lighting apparatus.

According to an aspect of the present invention, there is provided a lighting device which includes a light source; a light source supporting member which has a surface to which the light source is attached; and a heat sink which dissipates a heat generated by the light source on an opposite surface of the light source supporting member, wherein the heat sink includes a heat transfer member which protrudes from the surface of the light source supporting member; a plurality of first fins which are spaced apart from each other at intervals in a length direction of the heat transfer member, and are arranged parallel to the light source supporting member; and a plurality of second fins which are spaced apart from each other at intervals, surround outer portions of the first fins, and are arranged perpendicularly to the light source supporting member.

The plurality of second fins may be arranged in a radial direction with respect to the heat transfer member.

The plurality of second fins may protrude from the surface of the light source supporting member.

The heat sink may be formed of one or more selected from Cu, Al, Mg, and Fe.

A connecting portion may be formed on an end portion or an intermediate portion of the heat transfer member.

Slots for improving ventilation may be formed on the light source supporting member.

The second fins may protrude beyond the outer edge of the light source supporting member.

A width of a part of the second fin adjacent to the light source supporting member may be larger than a width of a part of the second fin a certain distance from the light source supporting member.

The light source supporting member may include a reflective body which reflects a light emitted from the light source in a certain direction, on a surface of the light source supporting member.

The light source may include an LED.

The light source may include a metal core printed circuit board (MCPCB) mounted on the light source supporting member, and an LED package mounted on the MCPCB.

The light source may include a submount mounted on the light source supporting member, and an LED chip mounted on the submount.

BRIEF DESCRIPTION OF THE DRAWINGS

The patent or application file contains at least one drawing executed in color. Copies of this patent or patent application publication with color drawings will be provided by the Office upon request and payment of the necessary fee.

The above and other aspects of the present invention will become more apparent by describing in detail exemplary embodiments thereof with reference to the attached drawings in which:

FIG. 9 is a graph illustrating variations of intensities of thermal resistances with arrangement angles of the lighting apparatus of FIGS. 3 through 5;

DETAILED DESCRIPTION OF EXEMPLARY EMBODIMENTS OF THE INVENTION

The present invention will now be described more fully with reference to the accompanying drawings, in which exemplary embodiments of the invention are shown.

Figure 1:
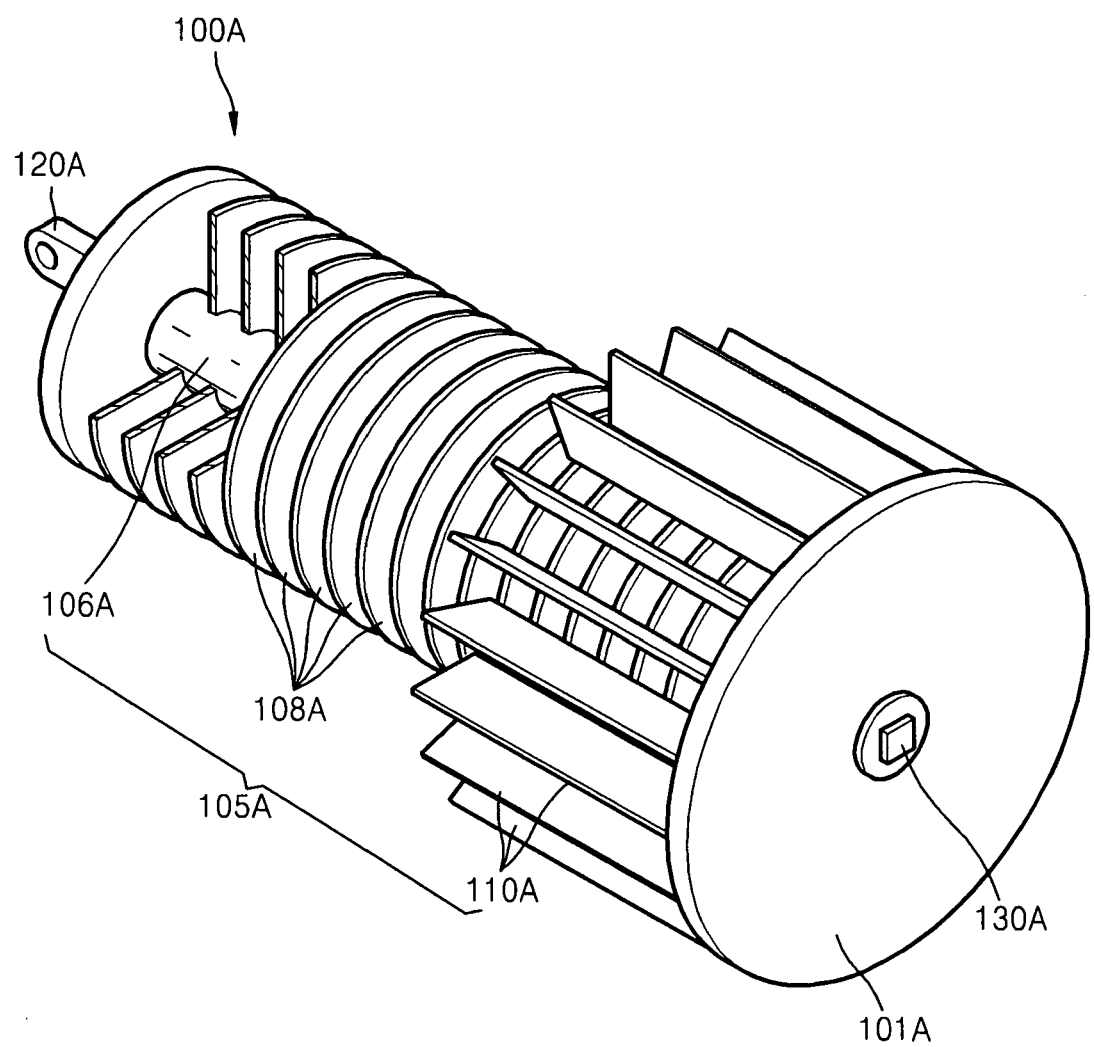
FIGS. 1 and 2 are a perspective view and a longitudinal cross-sectional view, respectively, of a lighting apparatus according to an exemplary embodiment of the present invention.
Figure 2:
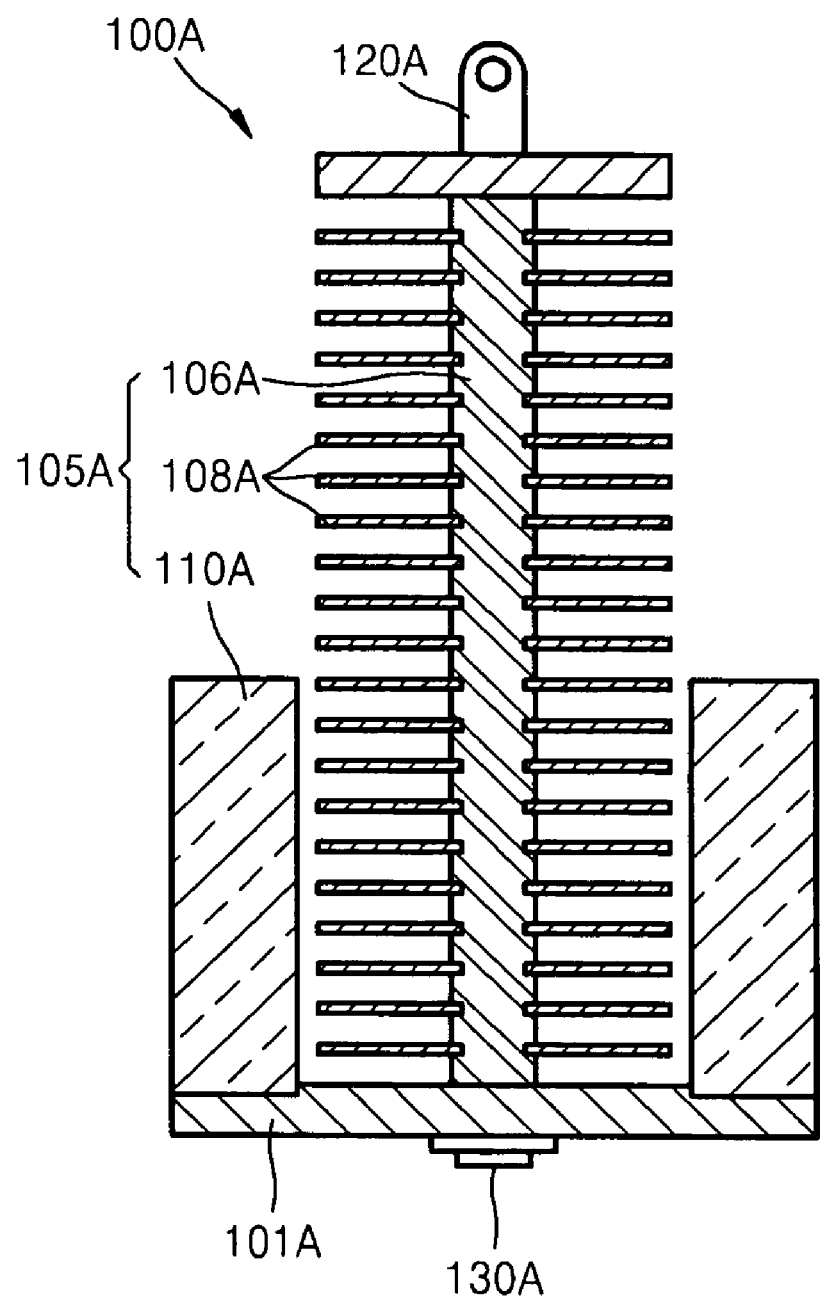

FIGS. 1 and 2 are a perspective view and a longitudinal cross-sectional view, respectively, of a lighting apparatus according to an exemplary embodiment of the present invention.

Referring to FIGS. 1 and 2, the lighting apparatus 100A according to an exemplary embodiment of the present invention includes a light source 130A, a light source supporting member 101A to which the light source 130A is attached, and a heat sink 105A, which is disposed on the light source supporting member 101A on an opposite side to the light source 130A. The heat sink 105A that dissipates heat generated by the light source 130A includes a thermal transfer member 106A which protrudes from the light source supporting member 101A in the opposite direction of the light source 130A, a plurality of first fins 108A arranged parallel to the light source supporting member 101A, and a plurality of second fins 110A arranged perpendicularly to the light source supporting member 101A.

The heat sink 105A can be fabricated using Cu, Al, Mg, Fe, or an alloy of these metals, which have a superior thermal conductivity and can be processed easily. The thermal transfer member 106A is formed as a bar, and the first fin 108A is formed as a disk. The first fins 108A are spaced at a predetermined distance apart from each other, in a length direction of the thermal transfer member 106A. According to an exemplary embodiment of the present invention, the first fins 108A are mounted on an outer circumference of the thermal transfer member 106A. However, unlike the exemplary embodiments of FIGS. 1 and 2, a heat sink in which the thermal transfer member and first fins are formed integrally with each other can also be fabricated.

The second fins 110A are formed as a rectangular plate. The second fins 110A are spaced at a predetermined distance, and surround outer sides of the first fins 108A. The second fins 110A are arranged in a radial direction with respect to the thermal transfer member 106A, and protrude from the surface of the light source supporting member 101A in the same direction in which the thermal transfer member 106A extends. In an exemplary embodiment, the second fins 110A are mounted on the light source supporting member 101A. However, the light source supporting member 101A and the second fins 110A may also be integrally formed with each other.

A connecting portion 120A is formed on an end portion of the thermal transfer member 106A in order to connect the lighting apparatus 100A to a supporting rod, ceiling, or wall. The light source 130A may include an LED.

The heat sink 105A of the lighting device 101A can dissipate the heat evenly, regardless of the arrangement angle of the lighting device 101A, by using the first fins 108A and the second fins 110A that are disposed perpendicularly to each other. Thermal transfer, including thermal conduction in the lighting device and air convection around the lighting device, was analyzed by using Icepak simulation software for the lighting device according to an exemplary embodiment, and two kinds of lighting devices that were used for comparison.

Figure 3:
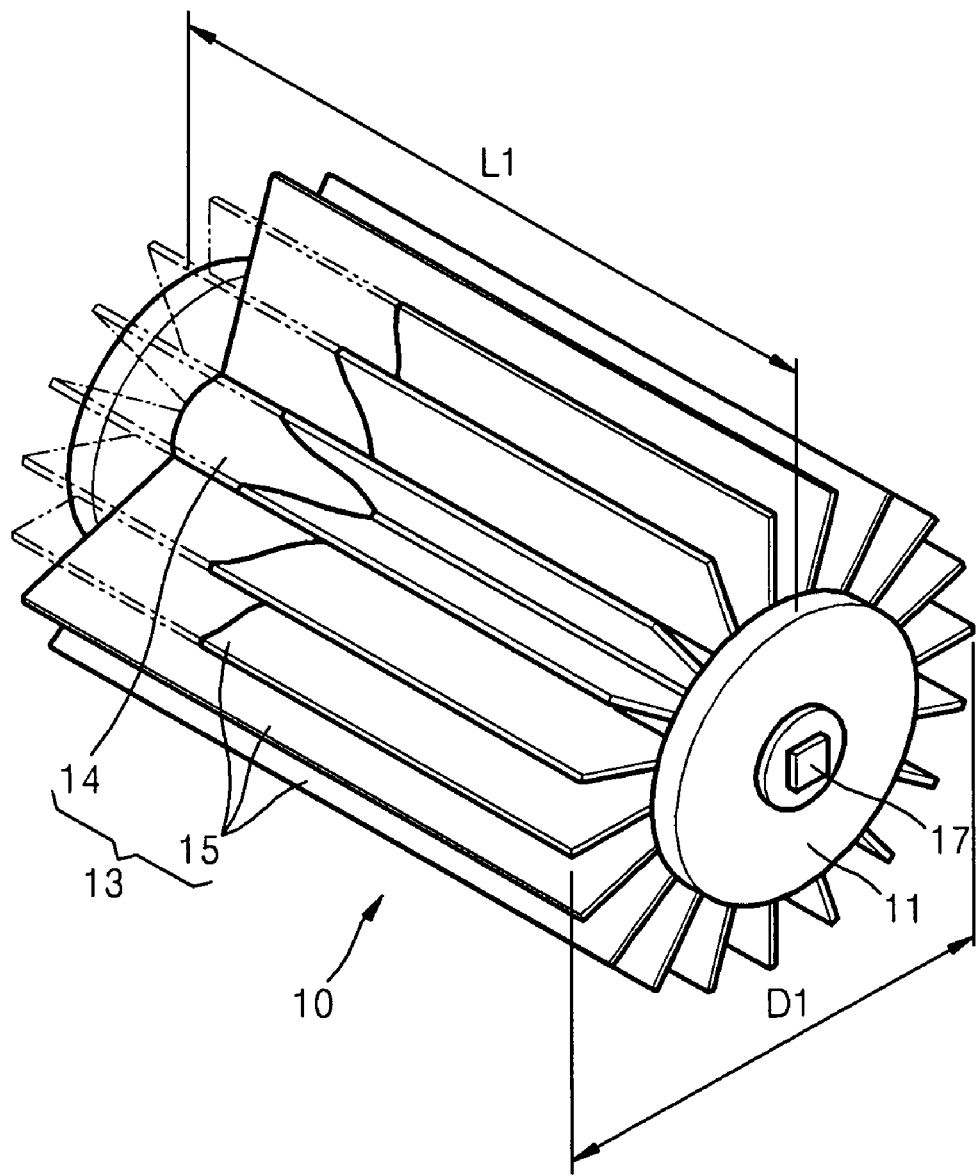
FIGS. 3 through 5 are perspective views of three kinds of light apparatuses as objects of analyzing thermal transfer.
Figure 4:
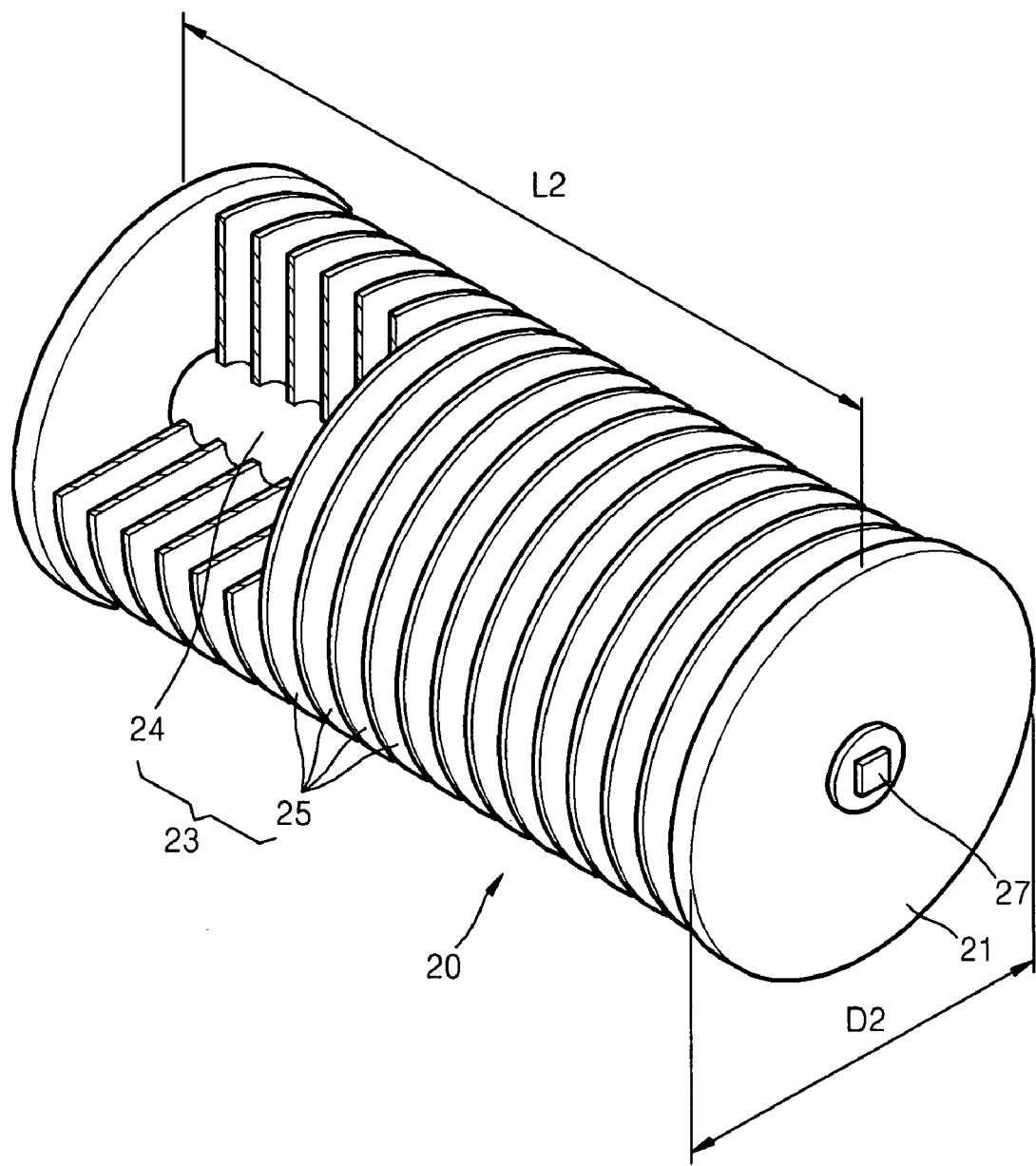
Figure 5:
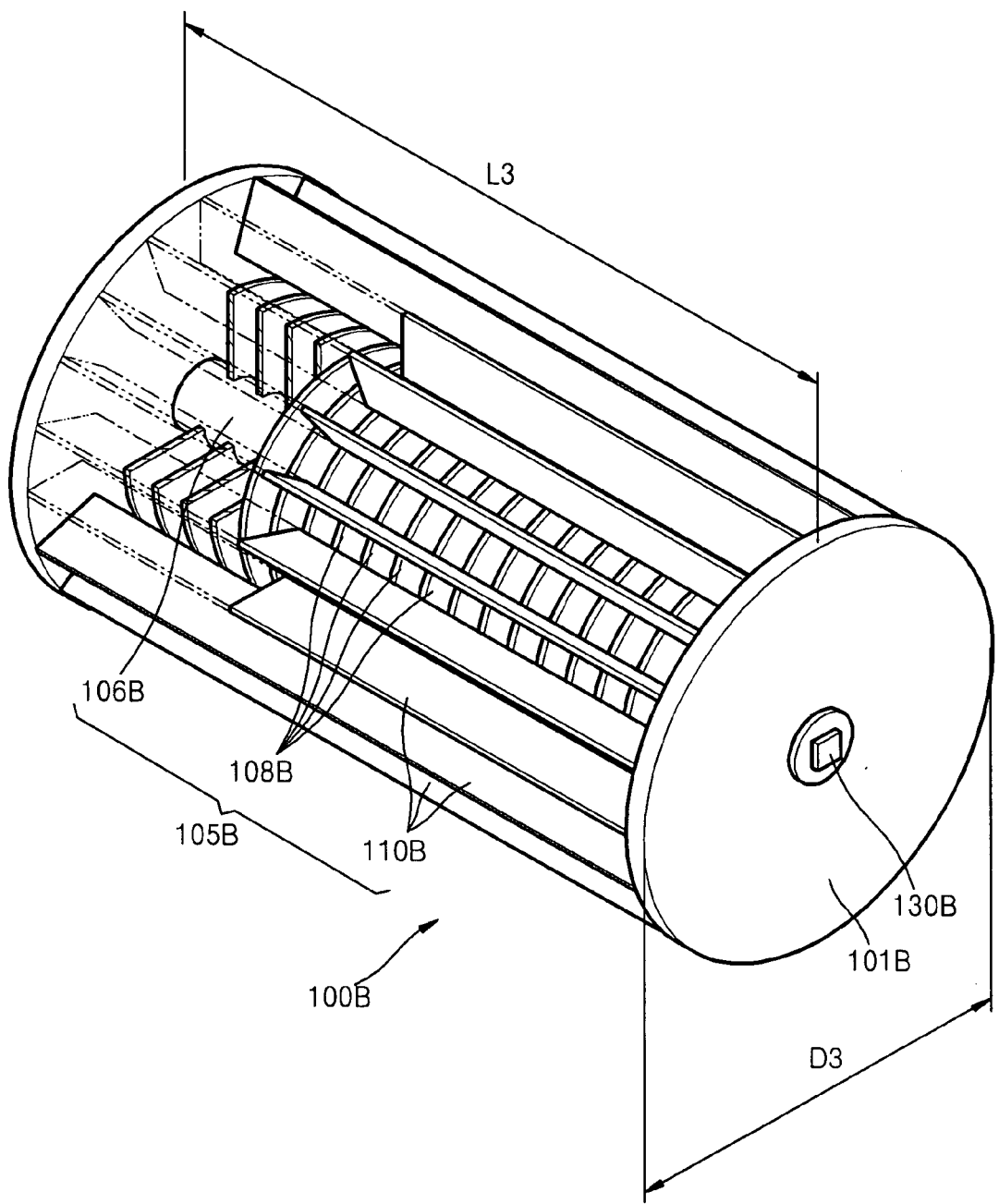

FIGS. 3 through 5 are perspective views of three kinds of lighting devices for which the thermal transfers were analyzed.

A lighting device 10 shown in FIG. 3 includes a light source 17, a light source supporting member 11 to which the light source 17 is attached, and a heat sink 13 for dissipating the heat generated from the light source 17. The heat sink 13 includes a thermal transfer member 14, which is formed as a bar protruding from a surface of the light source supporting member 11; and a plurality of vertical fins 15 that are spaced at predetermined intervals in a radial direction with respect to the thermal transfer member 14, and arranged perpendicularly to the light source supporting member 11. The lighting device 10 does not include horizontal fins arranged in parallel to the light source supporting member 11.

A lighting device 20 shown in FIG. 4 includes a light source 27, a light source supporting member 21, and a heat sink 23 for dissipating heat generated from the light source 27, like the device 10 of FIG. 3. The heat sink 23 includes a thermal transfer member 24, which is formed as a bar protruding from the light source supporting member 21 in a direction opposite to the light source 27; and a plurality of horizontal fins 25 which are arranged in parallel to the light source supporting member 21. However, the heat sink 23 does not include a vertical fin arranged perpendicularly to the light source supporting member 21.

Meanwhile, a lighting device 100B of FIG. 5 is a modified example of the lighting device 100A shown in FIGS. 1 and 2. The lighting device 100B includes a light source 130B, a light source supporting member 101B, and a heat sink 105B for dissipating the heat generated from the light source 130B, like the lighting devices 10 and 20 of FIGS. 3 and 4. The heat sink 105B includes a thermal transfer member 106B, which is formed as a bar protruding from the light source supporting member 101B in a direction opposite to the light source 130B; a plurality of first fins 108B mounted on an outer circumference of the thermal transfer member 106B, which are spaced at predetermined intervals in a lengthwise direction of the thermal transfer member 106B, and arranged in parallel to the light source supporting member 101B; and a plurality of second fins 110B, which are arranged in a radial direction, spaced apart at predetermined intervals, surround the outer portion of the first fins 108B, and are arranged perpendicularly to the light source supporting member 101B.

In order to analyze the thermal transfer of the three kinds of lighting devices 10, 20, and 100B, a temperature distribution under steady state conditions was simulated. It was assumed that there was a natural convection of the air around the lighting device that is heated by the light source, and that there was no forced convection of the air. In addition, in order to compare performances under the same conditions, the conditions were equalized. Lengths L1, L2, and L3 of the lighting devices 10, 20, and 100B were set as 102 mm; outer diameters D1, D2, and D3 were set as 70mm; thicknesses of the fins 15, 25, 108B, and 110B were set as 1 mm; distances between the horizontal fins 25 or the first fins 108B were set as 2 mm; arrangement angles of the vertical fins 15 or the second fins 110B were set as 10°; diameters of the thermal transfer members 14, 24, and 106B were set as 12 mm; caloric powers of the light sources 17, 27, and 130B were set as 10 W; the temperature around the lighting devices 10, 20, and 100B was set as 20° C.; and the heat sinks 13, 23, and 105B were formed of Al having a thermal conductivity of 205 W/mK. The arrangement angle of the lighting devices 10, 20, and 100B is 0° when the length direction of the thermal transfer member 14, 24, and 106B is parallel to the direction of gravity (g), and the light source 17, 27, and 130B is located on a lower end portion of the lighting device 10, 20, and 100B. The arrangement angle is 180° when the length direction of the thermal transfer member 14, 24, and 106B is parallel to the direction of gravity (g), and the light source 17, 27, and 130B is located on an upper end portion of the lighting device 10, 20, and 100B. The arrangement angle is 90° when the length direction of the thermal transfer member 14, 24, and 106B crosses the direction of gravity (g) at a right angle.

Figure 7A:
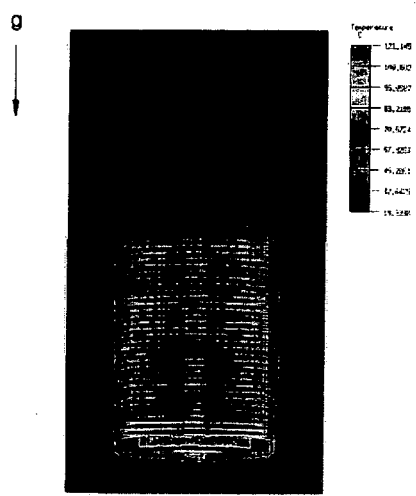
FIGS. 7A and 7B are views showing the results of analyzing the thermal transfer with respect to the lighting apparatus of FIG. 4.
Figure 7B:
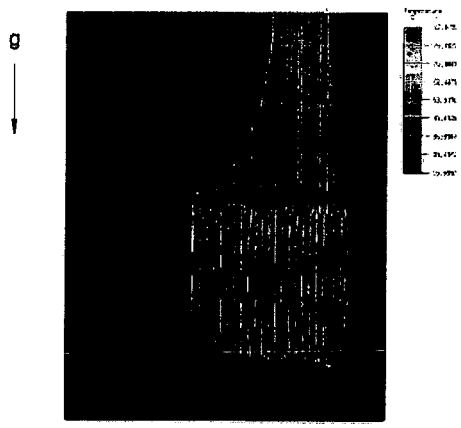
Figure 6A:
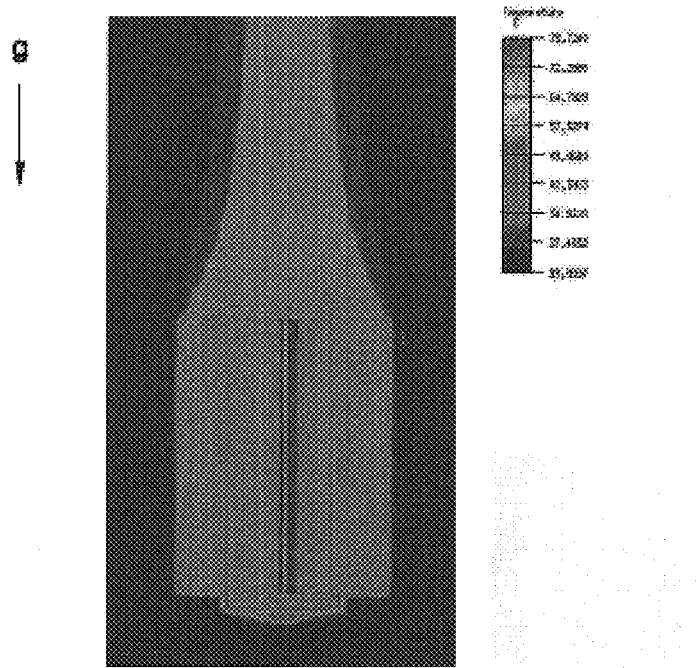
FIGS. 6A and 6B are views showing the results of analyzing the thermal transfer with respect to the lighting apparatus of FIG. 3.
Figure 6B:
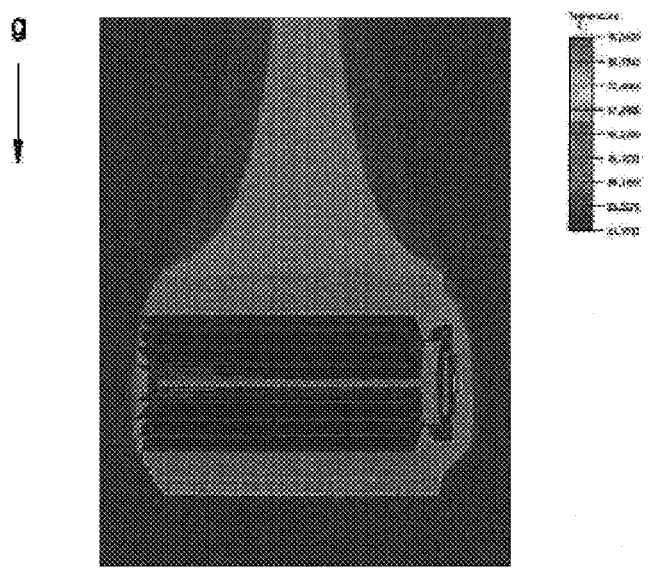
Figure 8A:
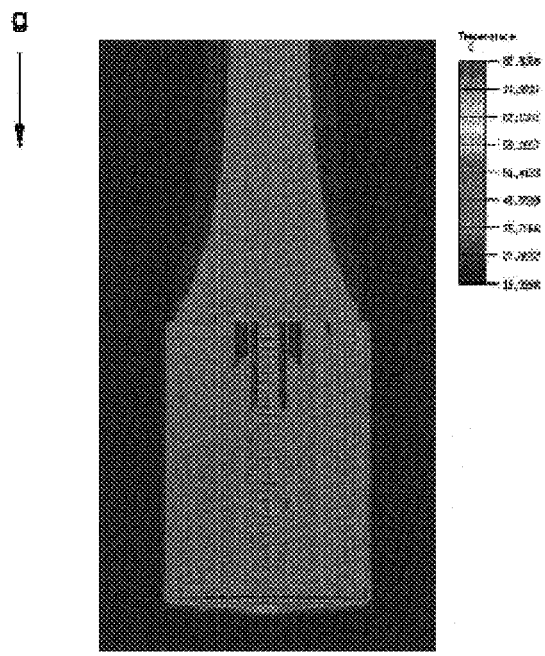
FIGS. 8A and 8B are views showing the results of analyzing the thermal transfer with respect to the lighting apparatus of FIG. 5.
Figure 8B:
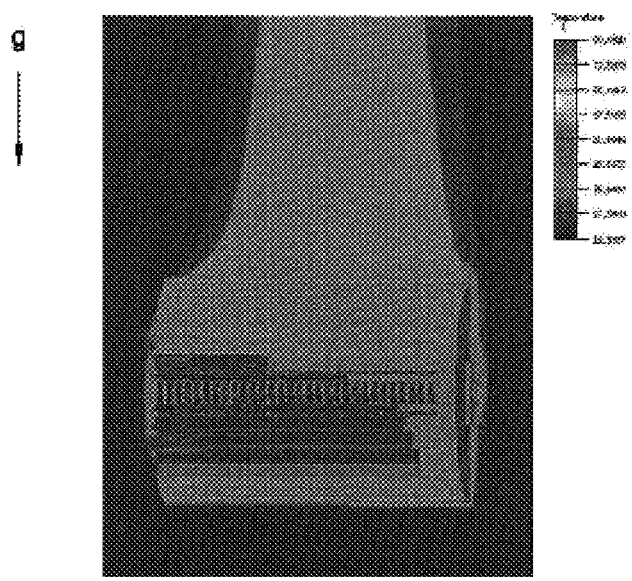

FIGS. 6A and 6B are views illustrating the results of the heat transfer analysis with respect to the lighting device 10 of FIG. 3. FIGS. 7A and 7B are views illustrating the results of the heat transfer analysis with respect to the lighting device 20 of FIG. 4. FIGS. 8A and 8B are views illustrating the results of the heat transfer analysis with respect to the lighting device 100B of FIG. 5. In the above drawings, temperature distributions of the lighting devices 10, 20, and 100B, and temperature distributions around the lighting devices 10, 20, and 100B due to the light emission of the light sources 17, 27, and 130B, respectively, are shown as color maps in which blue represents a low temperature and red represents a high temperature.

Referring to FIG. 6A, the heat dissipation of the light source 17 can be performed sufficiently when the arrangement angle of the lighting device 10 is 0°. When the temperature around the light source 17 increases due to the heat generation of the light source 17, a natural convection of air flow is generated in an opposite direction to the direction of gravity (g), from the lower portion to the upper portion. In addition, since the lighting device 10 of FIG. 3 includes the vertical fins 15, the vertical fins 15 do no interfere with the natural convection, which flows along the vertical fins 15, and the heat dissipation can be performed sufficiently. The temperature (Tj) of the light source 17 in the lighting device 10 was 79.7° C. when the arrangement angle of the lighting device 10 was 0°.

However, referring to FIG. 6B, the heat dissipation of the lighting device 10 of FIG. 3 cannot be performed sufficiently when the arrangement angle of the lighting device 10 is 90°. This is because the vertical fins 15 of the lighting device 10 are arranged perpendicularly to the direction of gravity (g), and the vertical fins 15 interfere with the natural convection flow generated when the light source 17 emits the heat. The temperature (Tj) of the light source 17 in the lighting device 10 was 96.5° C. when the arrangement angle of the lighting device 10 was 90°.

Referring to FIG. 7A, the heat dissipation of the light source 27 is not performed sufficiently when the arrangement angle of the lighting device 20 of FIG. 4 is 0°. Like FIG. 6B, since the horizontal fins 25 of the lighting device 20 are arranged perpendicularly to the direction of gravity (g), they interfere with the natural convection flow. The temperature (Tj) of the light source 27 in the lighting device 20 was 121.1° C. when the arrangement angle of the lighting device 20 is 0°.

Referring to FIG. 7B, the heat dissipation of the light source 27 is sufficiently performed when the arrangement angle of the lighting device 20 of FIG. 4 is 90°. Like FIG. 6A, since the horizontal fins 25 of the lighting device 20 are arranged parallel to the direction of gravity (g), the natural convection generated by the heat generation of the light source 27 can flow along the horizontal fins 25 from the lower portion to the upper portion, and the heat dissipation can be performed sufficiently. The temperature (Tj) of the light source 27 in the lighting device 20 was 88.0° C. when the arrangement angle of the lighting device 20 was 90°.

Referring to FIGS. 8A and 8B, the heat dissipation of the light source 130B is performed sufficiently when the arrangement angle of the lighting device 100B of FIG. 5 0° or 90°. When the arrangement angle of the lighting device 100B is 0°, the second fins 110B are arranged parallel to the gravity direction, and do not interfere with the natural convection flow generated due to the heat generation of the light source 130B. When the arrangement angle of the lighting device 100B is 90°, the first fins 108B are arranged parallel to the direction of gravity (g), and do not interfere with the natural convection flow caused by the heat generation of the light source 130B. The thermal transfer results are shown in FIGS. 8A and 8B. The temperature (Tj) of the light source 130B in the lighting device 100B was 82.8° C. when the arrangement angle of the lighting device 100B was 0°, and 80.0° C. when the arrangement angle of the lighting device 100B was 90°.

Thermal resistance is a ratio of a temperature difference and a unit heat transfer. Heat dissipation performances of the three kinds of lighting devices 10, 20, and 100B can be compared with each other by using the thermal resistances of the lighting devices 10, 20, and 100B. The thermal resistances of the lighting devices 10, 20, and 100B can be calculated using the following equation:

$$R_{ba} = \frac{(T_b - T_a)}{Q_L} \quad (1)$$

where $R_{ba}$ is a thermal resistance of the lighting device 10, 20, or 100B, $T_a$ is a temperature of the air around the light source, $T_b$ is a maximum temperature of the heat sink, which is a temperature of a boundary between the light source and the light source supporting member, and $Q_L$ is the amount of heat generated by the light source. The unit of thermal resistance is ° C./W.

If the thermal resistance is relatively large, the temperature of the lighting device is higher for the same amount of heat generation. Therefore, if the thermal resistance is large, the heat dissipation performance is degraded.

FIG. 9 is a graph illustrating variations of thermal resistances with arrangement angles of the lighting devices shown in FIGS. 3 through 5. Referring to FIG. 9, the thermal resistance $R_{ba}$ of the lighting device 10 of FIG. 3 is highest at the arrangement angle of 90°, and lowest at the arrangement angles of 0° and 180°. In addition, the difference between the highest thermal resistance and the lowest thermal resistance is 1.684° C./W. Thus, a problem may occur due to ineffective heat dissipation if the lighting device 10 of FIG. 3 is installed at the arrangement angle of 90°.

On the contrary, the thermal resistance $R_{ba}$ of the lighting device 20 of FIG. 4 is highest at the arrangement angles of 0° and 180°, and is lowest at the arrangement angle of 90°. In addition, the difference between the maximum thermal resistance and the minimum thermal resistance is 3.322° C./W. Therefore, a problem may occur due to ineffective heat dissipation if the arrangement angle of the lighting device 20 of FIG. 4 is 0° or 180°.

The thermal resistance $R_{ba}$ of the lighting device 100B of FIG. 5 is constant at about 3° C./W, regardless of the arrangement angle of the lighting device 100B, and a difference between the maximum thermal resistance and the minimum thermal resistance is just 0.418° C./W. Therefore, for the lighting device 100B, which has two kinds of fins 108B and 110B that cross each other, reliable heat dissipation performance can be obtained, regardless of the arrangement angle of the lighting device 100B.

Figure 10:
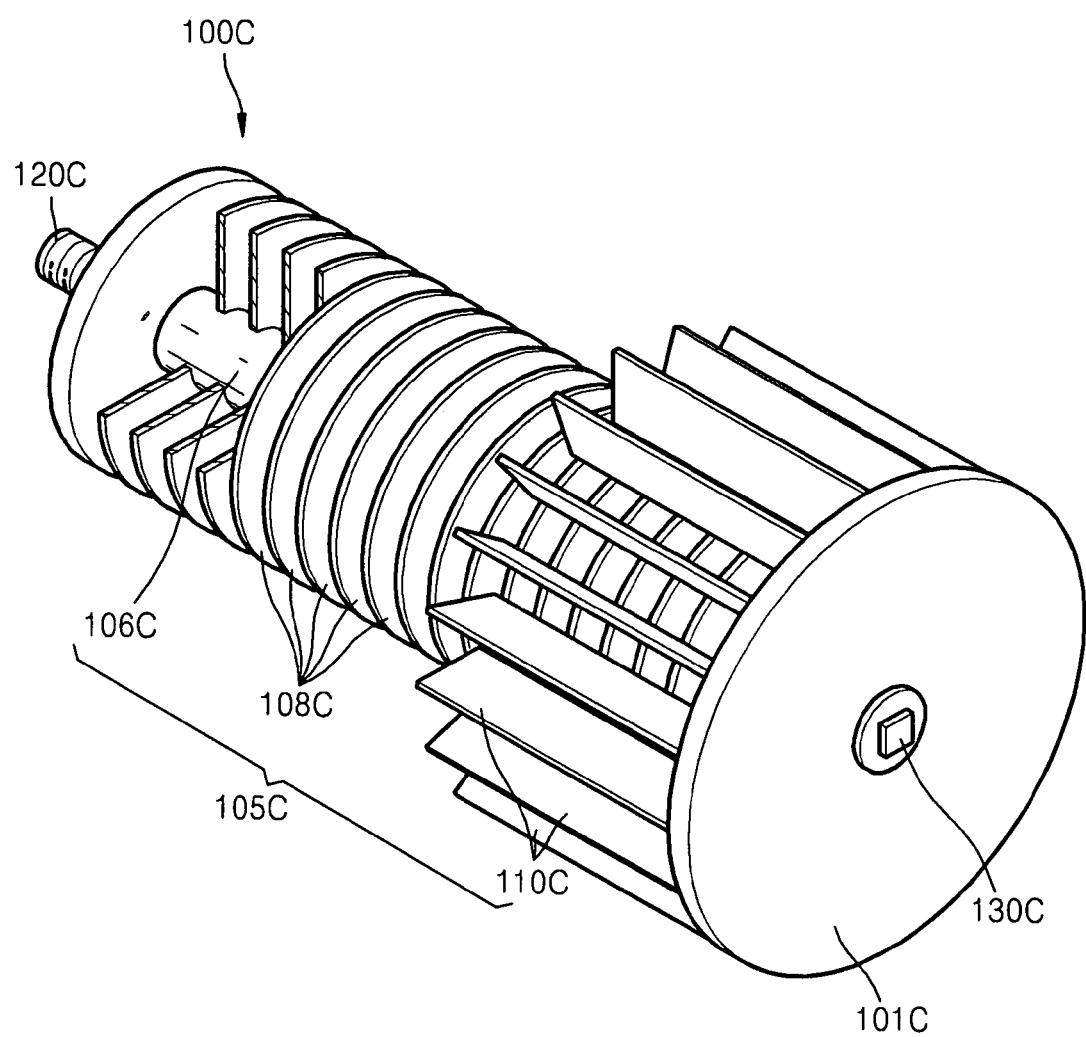
FIGS. 10 and 11 are perspective views of lighting apparatuses according to exemplary embodiments of the present invention.
Figure 11:
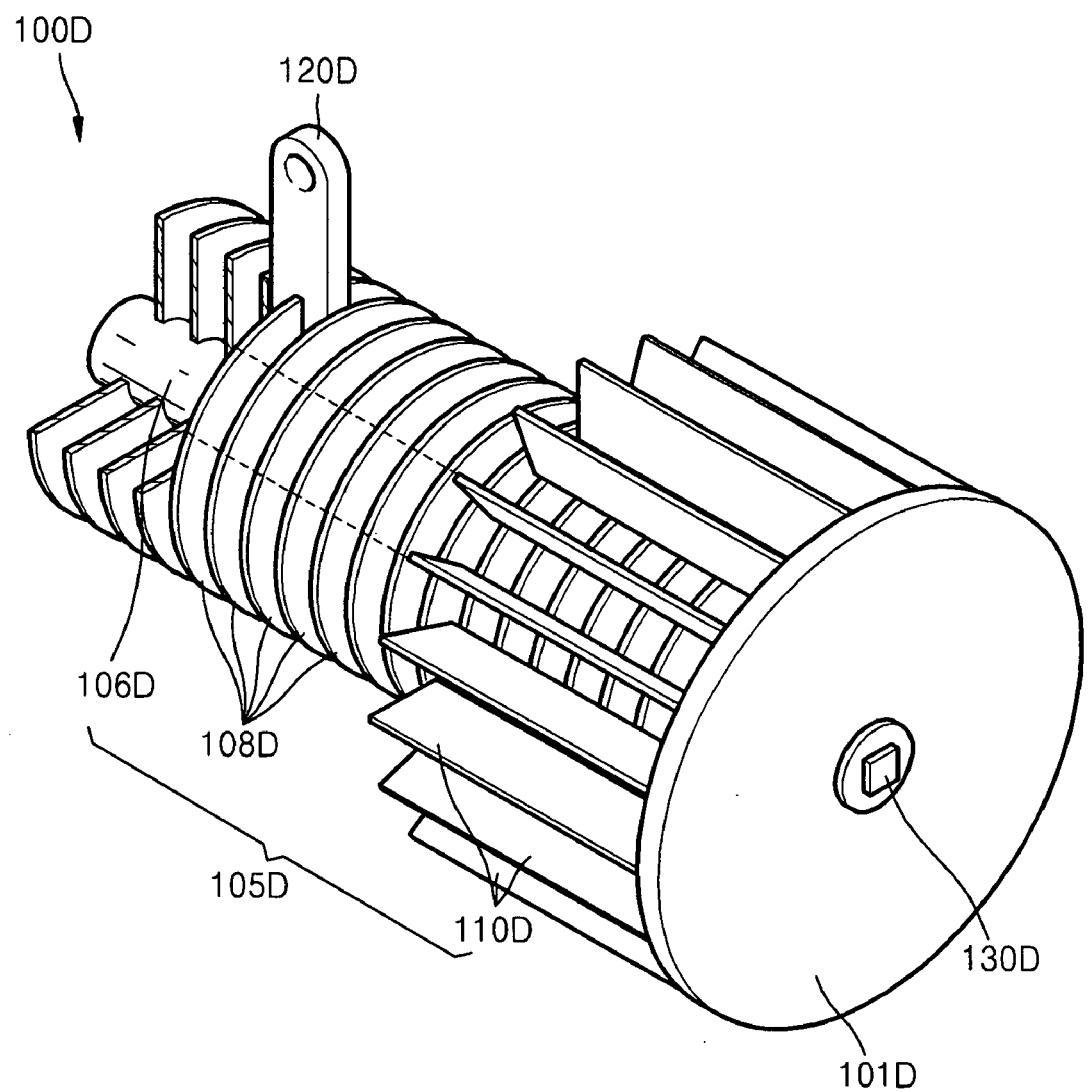
Figure 12:
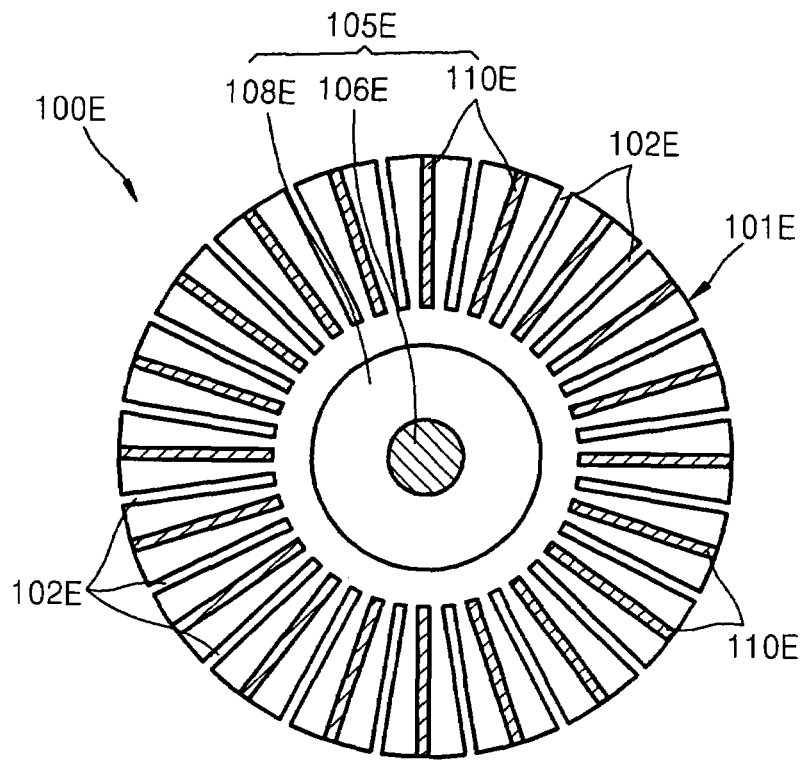
FIGS. 12 and 13 are transverse cross-sectional views of lighting apparatuses according to exemplary embodiments of the present invention.
Figure 13:
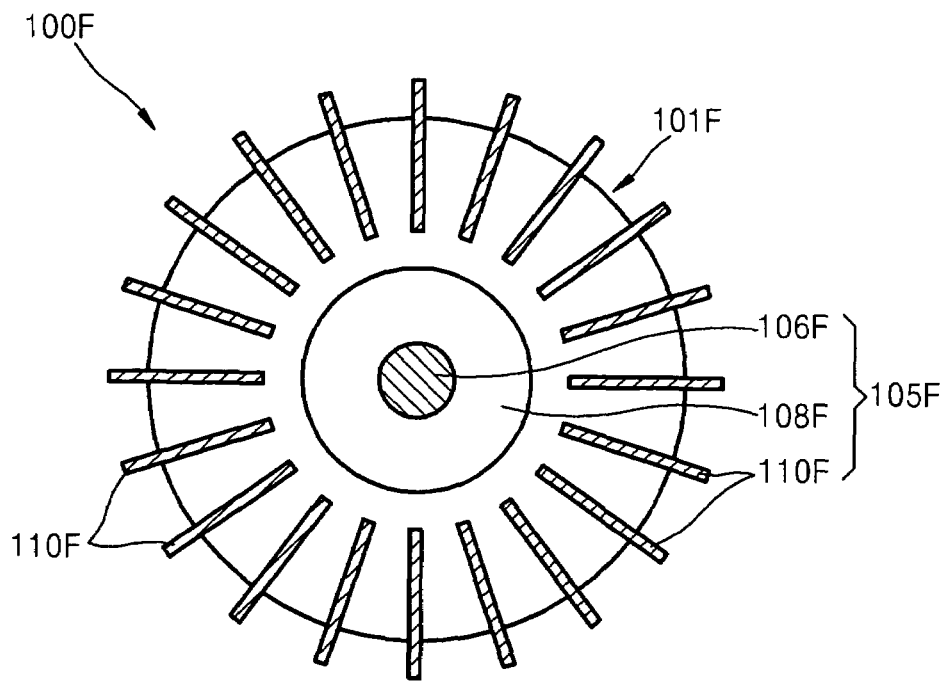
Figure 14:
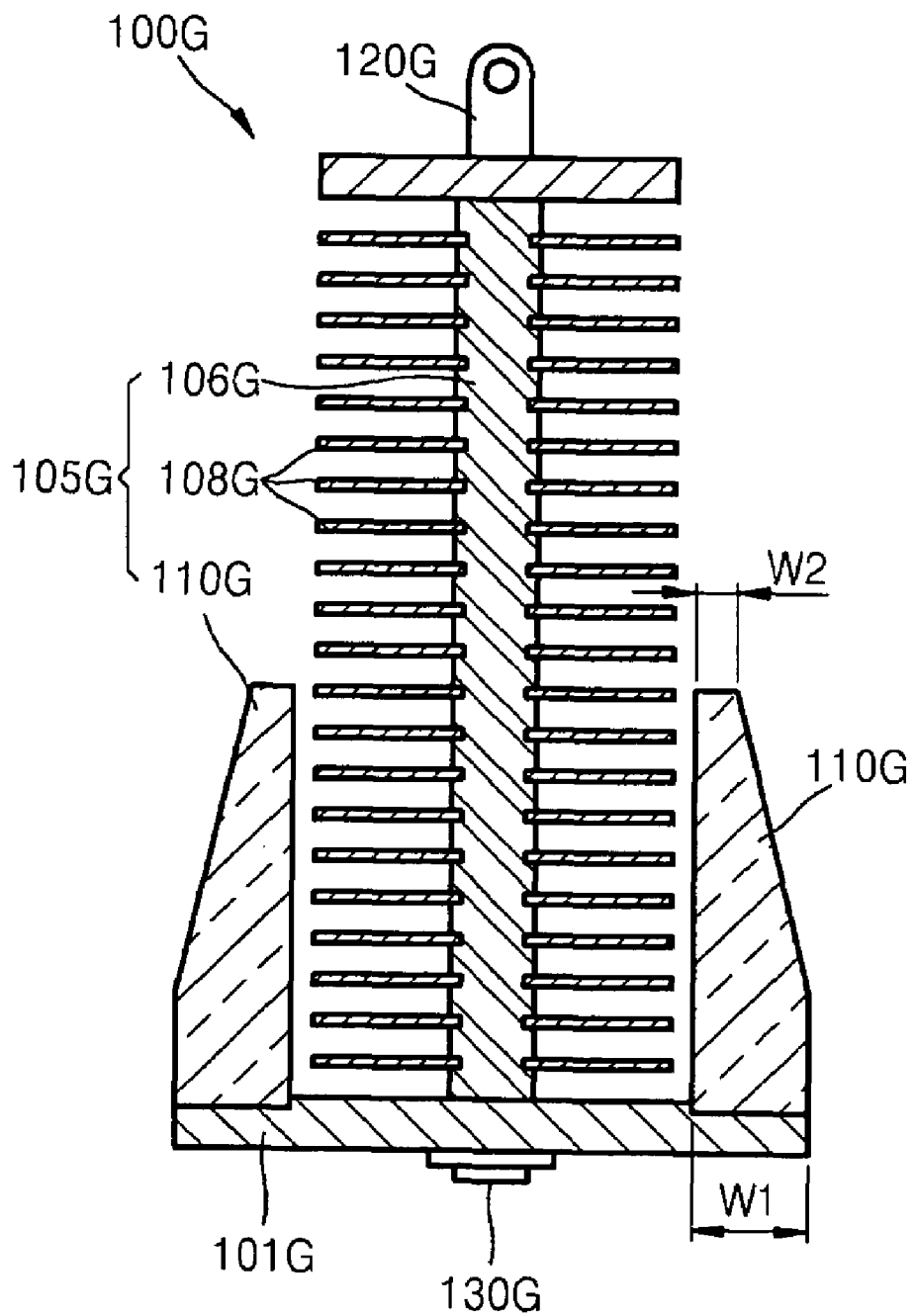
FIGS. 14 and 15 are longitudinal cross-sectional views of lighting apparatuses according to exemplary embodiments of the present invention.
Figure 15:
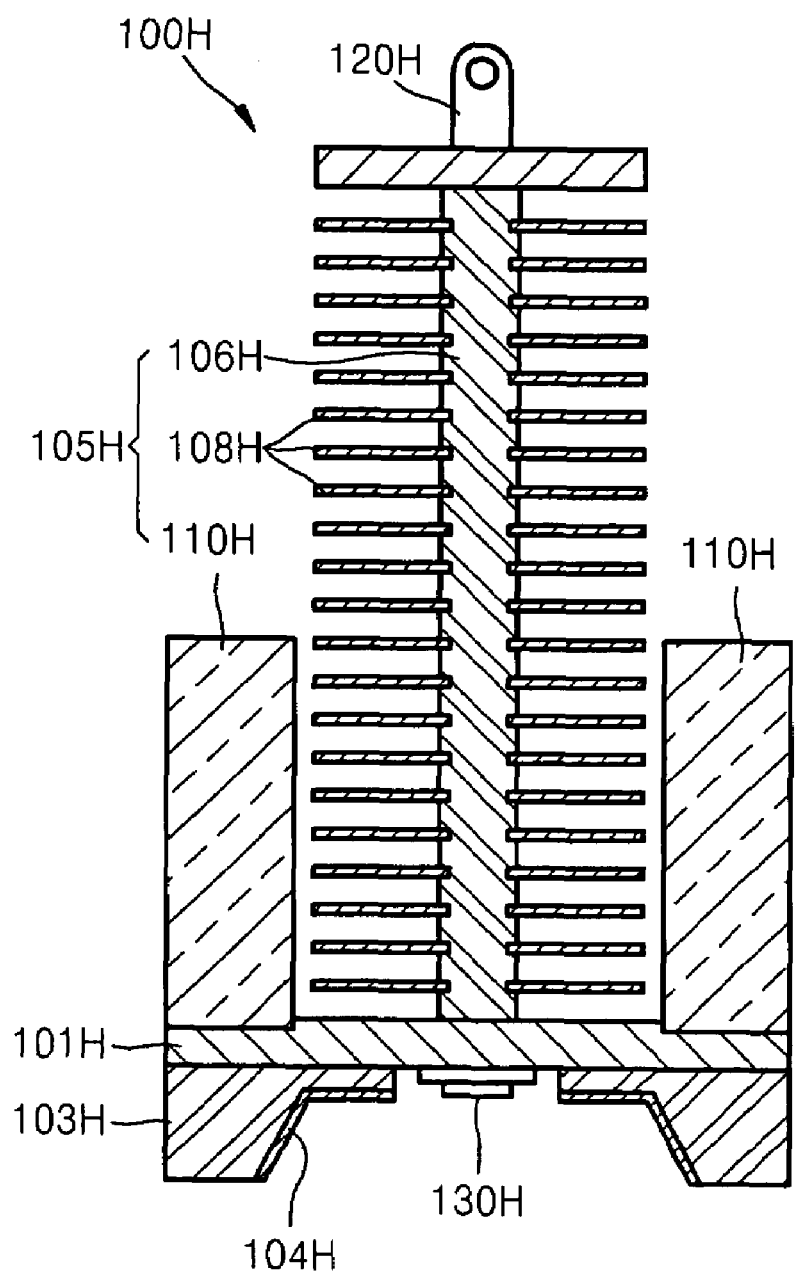

FIGS. 10 and 11 are perspective views of lighting devices according to exemplary embodiments of the present invention. FIGS. 12 and 13 are transverse cross-sectional views of lighting devices according to exemplary embodiments of the present invention. FIGS. 14 and 15 are longitudinal cross-sectional views of lighting devices according to exemplary embodiments of the present invention.

The lighting device according to the present invention can be embodied in various ways. For example, lighting devices 100C and 100D of FIGS. 10 and 11 respectively include light sources 130C and 130D, light source supporting members 101C and 101D, heat sinks 105C and 105D having heat transfer members 106C and 106D, first fins 108C and 108D, and second fins 110C and 110D, and are similar to the lighting device 100A of FIGS. 1 and 2, respectively. However, the lighting device 100C of FIG. 10 includes a connecting portion 120C for mounting the lighting device 100C onto a supporting rod, ceiling, or wall. The connecting portion 120C is a screw, unlike the connecting portion 120A of the lighting device 100A shown in FIGS. 1 and 2. The connecting portion 120C of the lighting device 100C can be inserted into a socket (not shown), in which a nut is formed. In addition, the lighting device 100D of FIG. 11 includes a connecting portion 120D on an intermediate portion of the heat transfer member 106D. The stick-type connecting portion 120D can be attached to the heat transfer member 106D after removing a part of the first fin 108D, or can be formed integrally with the heat transfer member 106D.

Lighting devices 100E and 100F of FIGS. 12 and 13 respectively include light sources (not shown), light source supporting members 101E and 101F, heat sinks 105E and 105F having heat transfer members 106E and 106F, first fins 108E and 108F, and second fins 110E and 110F. The lighting device 100E of FIG. 12 includes a plurality of slots 102E on the light source supporting member 101E. The slots 102E are formed between neighboring second fins 110E in order to improve the ventilation between the second fins 110E, and improve the heat dissipation performance of the heat sink 105E.

In the lighting device 100F of FIG. 13, the second fins 110F protrude out of the outer circumference of the light source supporting member 101F. The second fins 110F, which have a larger area and protrude out of the light source supporting member 101F, accelerate the thermal exchange between the convection caused by the heat generation of the light source (not shown) and the second fins 110F, in order to improve the heat dissipation performance of the heat sink 105F.

Lighting devices 100G and 100H of FIGS. 14 and 15 respectively include light sources 130G and 130H, light source supporting members 101G and 101H, heat sinks 105G and 105H having thermal transfer members 106G and 106H, first fins 108G and 108H, second fins 110G and 110H, and connecting portions 120G and 120H on end portions of the heat transfer members 106G and 106H. In the lighting device 100G of FIG. 14, the second fin 110G is cut in order to be inclined, so that a width W1 of the part of the second fin 110G adjacent to the light source supporting member 101G is wider than a width W2 of a part of the second fin 110G a certain distance away from the light source supporting member 101G. Due to the shape of the second fins 110G, the lighting device 100G can be easily installed in a narrow space, such as a concave wall or ceiling suitable for the incandescent bulb, and has a superior appearance. Although it is not shown in FIG. 14, the second fin may also be cut to have steps.

The lighting device 100H of FIG. 15 further includes a reflective body 103H on a surface of the light source supporting member 101H, to which the light source 130H is attached, for reflecting the light emitted from the light source 130H in a downward direction. A metal having a high light-reflectivity, such as Ag, Pb, or Sn, may be coated on a surface of the reflective body 103H in order to form a light-reflective layer 104H. Although it is not shown in FIG. 15, the reflective body 103H may be formed integrally with the light source supporting member 101H.

Figure 16:
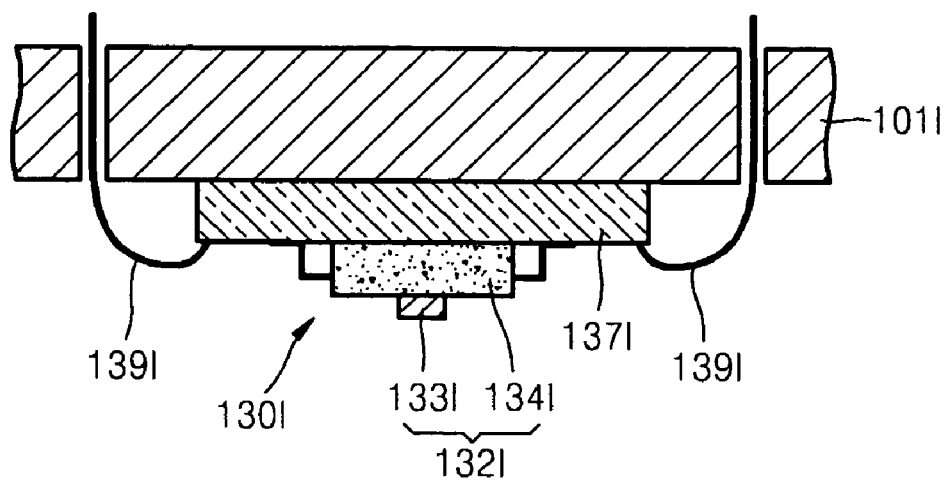
FIGS. 16 and 17 are longitudinal cross-sectional views of light sources in the lighting apparatuses according to exemplary embodiments of the present invention.
Figure 17:
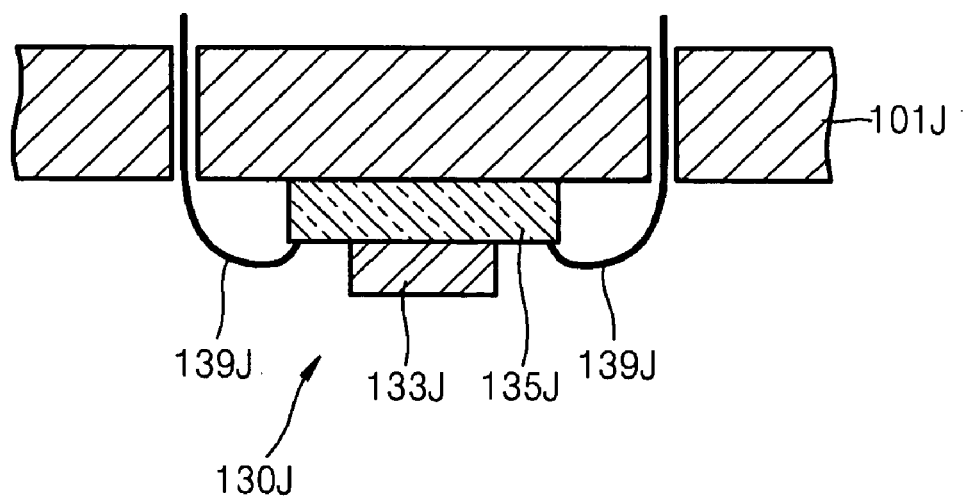

FIGS. 16 and 17 are longitudinal cross-sectional views of light sources in the lighting devices according to exemplary embodiments of the present invention. The light sources 130I and 130J of FIGS. 16 and 17 can substitute for the light sources 130A through 130H included in the lighting devices 100A through 100H.

Referring to FIG. 16, the light source 130I can include a metal core printed circuit board (MCPCB) 137I mounted on a light source supporting member 101I, and an LED package 132I mounted on the MCPCB 137I. The LED package 132I includes an LED chip 133I mounted on a metal slug (not shown), and a package body 134I formed of an insulating resin that surrounds the metal slug. The MCPCB 137I, which has a high heat dissipating property, is disposed in a manner that allows the sufficient transfer of the heat generated by the LED chip 133I to the light source supporting member 101I. Reference numeral 139I denotes a line electrically connecting a power supply unit (not shown) of the lighting device to the MCPCB 137I. In FIG. 16, only one LED package 132I is shown; however, a plurality of LED packages 132I may be mounted on the MCPCB 137I.

Referring to FIG. 17, the light source 130J includes a submount 135J mounted on a light source supporting member 101J, and an LED chip 133J mounted on the submount 135J. The submount 135J transfers the heat generated by the LED chip 133J to the light source supporting member 101J, and electrically connects a power supply unit (not shown) of the lighting device to the LED chip 133J. The submount 135J may be formed of Si. Reference numeral 139J denotes a line for electrically connecting the power supply unit to the submount 135J.

The lighting device according to exemplary embodiments of the present invention includes two kinds of fins that are arranged to cross each other, and can dissipate the heat reliably, regardless of the arrangement angle of the lighting device. Therefore, a life span reduction of the lighting device and a color shift can be prevented, and the lighting device can be installed without being limited by the installation space.

While the present invention has been particularly shown and described with reference to exemplary embodiments thereof, it will be understood by those of ordinary skill in the art that various changes in form and details may be made therein without departing from the spirit and scope of the present invention as defined by the following claims and their legal equivalents.

What is claimed is:

1. A lighting device comprising:
   a light source;
   a light source supporting member which has a surface to which the light source is attached; and
   a heat sink which dissipates a heat generated by the light source on an opposite surface of the light source supporting member,
   wherein the heat sink comprises:
      a heat transfer member which protrudes from the surface of the light source supporting member;
      a plurality of first fins which are spaced apart from each other at intervals in a length direction of the heat transfer member, and are arranged parallel to the light source supporting member; and
      a plurality of second fins which are spaced apart from each other at intervals, surround outer portions of the first fins, and are arranged perpendicularly to the light source supporting member.

2. The lighting device of claim 1, wherein the plurality of second fins are arranged in a radial direction with respect to the heat transfer member.

3. The lighting device of claim 2, wherein the second fins protrude beyond the outer edge of the light source supporting member.

4. The lighting device of claim 1, wherein the plurality of second fins protrude from the surface of the light source supporting member.

5. The lighting device of claim 1, wherein the heat sink is formed of one or more selected from Cu, Al, Mg, and Fe.

6. The lighting device of claim 1, wherein a connecting portion is formed on an end portion or an intermediate portion of the heat transfer member.

7. The lighting device of claim 1, wherein slots which improve ventilation are formed on the light source supporting member.

8. The lighting device of claim 1, wherein a width of a part of the second fin adjacent to the light source supporting member is larger than a width of a part of the second fin a distance from the light source supporting member.

9. The lighting device of claim 1, wherein the light source supporting member includes a reflective body which reflects a light emitted from the light source, on a surface of the light source supporting member.

10. The lighting device of claim 1, wherein the light source comprises a light emitting diode (LED).

11. The lighting device of claim 1, wherein the light source comprises a metal core printed circuit board (MCPCB) mounted on the light source supporting member, and a light emitting diode (LED) package mounted on the MCPCB.

12. The lighting device of claim 1, wherein the light source comprises a submount mounted on the light source supporting member, and a light emitting diode (LED) chip mounted on the submount.

13. The lighting device of claim 1, wherein each of the plurality of first fins is formed as a disk.

14. The lighting device of claim 13, wherein each of the plurality of second fins is formed as a rectangular plate.

15. The lighting device of claim 1, wherein each of the plurality of second fins is formed as a rectangular plate.

* * * * *